(12) United States Patent
Sanuki et al.

(10) Patent No.: US 11,450,611 B2
(45) Date of Patent: Sep. 20, 2022

(54) SEMICONDUCTOR DEVICE AND METHOD OF MANUFACTURING THE SAME

(71) Applicant: Kioxia Corporation, Tokyo (JP)

(72) Inventors: Tomoya Sanuki, Yokkaichi (JP);
Keisuke Nakatsuka, Kobe (JP);
Yasuhito Yoshimizu, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 114 days.

(21) Appl. No.: 17/015,868

(22) Filed: Sep. 9, 2020

(65) Prior Publication Data
US 2021/0074638 A1 Mar. 11, 2021

(30) Foreign Application Priority Data

Sep. 11, 2019 (JP) .............................. JP2019-165574

(51) Int. Cl.
| | |
|---|---|
| H01L 23/48 | (2006.01) |
| H01L 23/52 | (2006.01) |
| H01L 29/40 | (2006.01) |
| H01L 23/535 | (2006.01) |
| H01L 25/065 | (2006.01) |
| H01L 25/18 | (2006.01) |
| H01L 23/00 | (2006.01) |

(Continued)

(52) U.S. Cl.
CPC ...... *H01L 23/535* (2013.01); *H01L 21/76805* (2013.01); *H01L 21/76895* (2013.01); *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC combination set(s) only.
See application file for complete search history.

(56) References Cited

U.S. PATENT DOCUMENTS

| | | | |
|---|---|---|---|
| 6,198,122 B1 * | 3/2001 | Habu | ................ H01L 27/10894 257/306 |
| 11,018,133 B2 * | 5/2021 | Or-Bach | ............... H01L 23/528 |

(Continued)

FOREIGN PATENT DOCUMENTS

| | | | | |
|---|---|---|---|---|
| CN | 102456723 A | * | 5/2012 | |
| CN | 110192269 A | * | 8/2019 | ........... G11C 11/005 |

(Continued)

*Primary Examiner* — Niki H Nguyen
(74) *Attorney, Agent, or Firm* — Oblon, McClelland, Maier & Neustadt, L.L.P.

(57) ABSTRACT

In one embodiment, a semiconductor device includes a substrate including two element regions that extend in a first direction parallel to a surface of the substrate and are adjacent to each other in a second direction crossing the first direction. The device further includes an interconnection layer provided above the substrate. The device further includes an insulator provided between the substrate and the interconnection layer. The device further includes a plug extending in the second direction and in a third direction crossing the first and second directions in the insulator, provided on each of the element regions, and electrically connected to the element regions and the interconnection layer.

18 Claims, 8 Drawing Sheets

(51) Int. Cl.
*H01L 21/768* (2006.01)
*H01L 25/00* (2006.01)

(56) References Cited

U.S. PATENT DOCUMENTS

| | | | |
|---|---|---|---|
| 2003/0067043 A1* | 4/2003 | Zhang | H01L 29/76 257/390 |
| 2003/0173674 A1* | 9/2003 | Nakamura | H01L 24/05 257/758 |
| 2004/0084777 A1* | 5/2004 | Yamanoue | H01L 23/585 257/E21.244 |
| 2008/0001291 A1* | 1/2008 | Nagai | H01L 28/57 257/758 |
| 2008/0014727 A1* | 1/2008 | Takaishi | H01L 28/91 438/510 |
| 2008/0170428 A1* | 7/2008 | Kinoshita | H01L 27/2472 257/E21.664 |
| 2009/0085135 A1* | 4/2009 | Bang | H01L 27/1469 257/E31.127 |
| 2009/0102059 A1* | 4/2009 | Ishii | H01L 23/5226 257/E23.145 |
| 2009/0186471 A1* | 7/2009 | Jung | H01L 21/823814 438/510 |
| 2011/0115073 A1* | 5/2011 | Chen | H01L 24/05 257/E21.59 |
| 2011/0201171 A1* | 8/2011 | Disney | H01L 21/763 257/E21.551 |
| 2011/0254106 A1* | 10/2011 | Katakami | H01L 29/517 257/E21.409 |
| 2011/0266677 A1* | 11/2011 | Zhu | H01L 23/522 438/653 |
| 2011/0305058 A1* | 12/2011 | Park | H01L 27/2436 365/63 |
| 2013/0320451 A1* | 12/2013 | Liu | H01L 29/66545 257/E27.06 |
| 2015/0076669 A1* | 3/2015 | Chang | H01L 21/76804 438/701 |
| 2015/0263011 A1* | 9/2015 | Hong | H01L 27/11582 438/269 |
| 2015/0348825 A1* | 12/2015 | Hebert | H01L 21/764 438/421 |
| 2016/0027901 A1* | 1/2016 | Park | H01L 21/0228 438/300 |
| 2018/0366583 A1* | 12/2018 | Kim | H01L 27/0924 |
| 2018/0374858 A1 | 12/2018 | Hsieh et al. | |

FOREIGN PATENT DOCUMENTS

| | | | | |
|---|---|---|---|---|
| JP | 2010-129686 A | | 6/2010 | |
| JP | 2013058584 A | * | 3/2013 | H01L 23/522 |

* cited by examiner

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2019-165574, filed on Sep. 11, 2019, the entire contents of which are incorporated herein by reference.

FIELD

Embodiments described herein relate to a semiconductor device and a method of manufacturing the same.

BACKGROUND

When a contact plug is formed to contact with a substrate, there is a problem that a contact resistance between the substrate and the contact plug increases.

DETAILED DESCRIPTION

In one embodiment, a semiconductor device includes a substrate including two element regions that extend in a first direction parallel to a surface of the substrate and are adjacent to each other in a second direction crossing the first direction. The device further includes an interconnection layer provided above the substrate. The device further includes an insulator provided between the substrate and the interconnection layer. The device further includes a plug extending in the second direction and in a third direction crossing the first and second directions in the insulator, provided on each of the element regions, and electrically connected to the element regions and the interconnection layer.

Embodiments will now be explained with reference to the accompanying drawings. The same components are given the same signs in FIGS. 1 to 10, and their duplicated description is omitted.

First Embodiment

Figure 1:
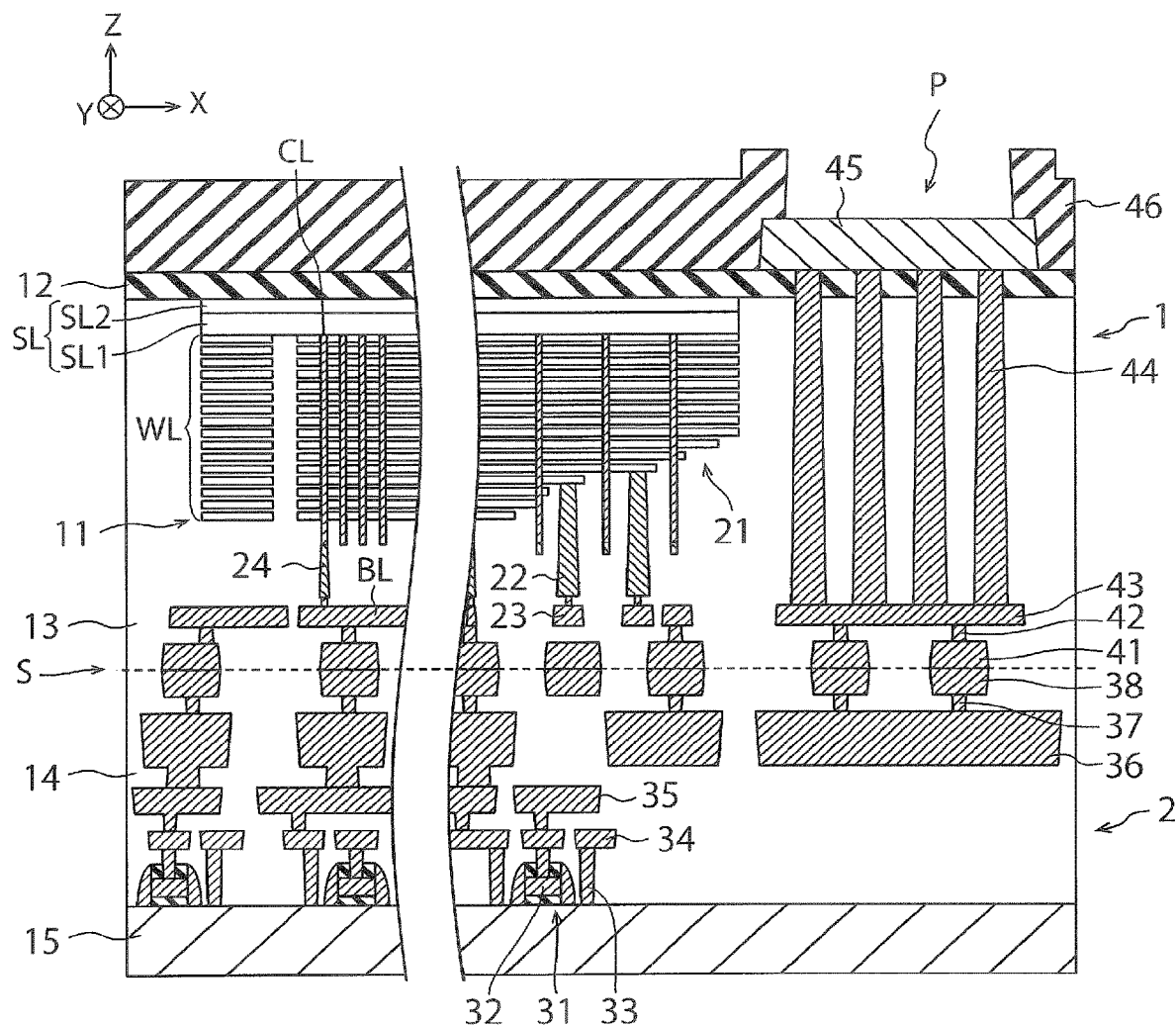
FIG. 1 is a cross-sectional view showing a structure of a semiconductor device of a first embodiment.

FIG. 1 is a cross-sectional view showing a structure of a semiconductor device of a first embodiment. The semiconductor device in FIG. 1 is a three-dimensional memory in which an array chip 1 and a circuit chip 2 are pasted together.

The array chip 1 includes a memory cell array 11 including a plurality of memory cells, an insulator 12 above the memory cell array 11, and an inter layer dielectric 13 below the memory cell array 11. The insulator 12 is exemplarily a silicon oxide film or a silicon nitride film. The inter layer dielectric 13 is exemplarily a silicon oxide film or a stacked film including a silicon oxide film and another insulator.

The circuit chip 2 is provided beneath the array chip 1. Sign S designates a plane on which the array chip 1 and the circuit chip 2 are pasted together. The circuit chip 2 includes an inter layer dielectric 14, and a substrate 15 beneath the inter layer dielectric 14. The inter layer dielectric 14 is exemplarily a silicon oxide film or a stacked film including a silicon oxide film and another insulator. The substrate 15 is exemplarily a semiconductor substrate such as a silicon substrate.

FIG. 1 shows an X-direction and a Y-direction which are parallel to a surface of the substrate 15 and perpendicular to each other, and a Z-direction perpendicular to the surface of the substrate 15. In the present specification, the +Z-direction is regarded as the upward direction, and the −Z-direction is regarded as the downward direction. The −Z-direction may coincide with the direction of gravity but does not have to coincide therewith. The Y-direction is exemplarily a first direction, the X-direction is exemplarily a second direction crossing the first direction, and the Z-direction is exemplarily a third direction crossing the first and second directions.

The array chip 1 includes, as electrode layers in the memory cell array 11, a plurality of word lines WL and a source line SL. FIG. 1 shows a step structure portion 21 of the memory cell array 11. Each word line WL is electrically connected to a word interconnection layer 23 via a contact plug 22. Each columnar portion CL penetrating the plurality of word lines WL is electrically connected to a bit line BL via a via plug 24, and is electrically connected to the source line SL. The source line SL includes a first layer SL1 which is a semiconductor layer, and a second layer SL2 which is a metal layer.

The circuit chip 2 includes a plurality of transistors 31. Each transistor 31 includes a gate electrode 32 provided on the substrate 15 via a gate insulator, and not shown source diffusion layer and drain diffusion layer provided in the substrate 15. Moreover, the circuit chip 2 includes a plurality of contact plugs 33 provided on these source diffusion layers and drain diffusion layers of the transistors 31, an interconnection layer 34 provided on these contact plugs 33 and including a plurality of interconnections, and an interconnection layer 35 provided on the interconnection layer 34 and including a plurality of interconnections.

The circuit chip 2 further includes an interconnection layer 36 provided on the interconnection layer 35 and including a plurality of interconnections, a plurality of via plugs 37 provided on the interconnection layer 36, and a plurality of metal pads 38 provided on these via plugs 37. The metal pads 38 are formed, for example, by a Cu (copper) layer or an Al (aluminum) layer. The metal pad 38 is exemplarily a first pad. The circuit chip 2 functions as a control circuit (logic circuit) which controls operation of the array chip 1. The control circuit is constituted of the transistors 31 and the like, and electrically connected to the metal pads 38.

The array chip 1 includes a plurality of metal pads 41 provided on the metal pads 38, a plurality of via plugs 42 provided on the metal pads 41, and an interconnection layer 43 provided on these via plugs 42 and including a plurality of interconnections. The metal pads 41 are formed, for example, by a Cu layer or an Al layer. The metal pad 41 is exemplarily a second pad.

The array chip 1 further includes a plurality of via plugs 44 provided on the interconnection layer 43, a metal pad 45 provided on these via plugs 44 and the insulator 12, and a passivation film 46 provided on the metal pad 45 and the insulator 12. The metal pad 45 is exemplarily a Cu layer or an Al layer, and functions as an external connection pad (bonding pad) of the semiconductor device in FIG. 1. The metal pad 45 is exemplarily a third pad. The passivation film 46 is exemplarily an insulator such as a silicon oxide film, and has an opening portion P from which the upper face of the metal pad 45 is exposed. The metal pad 45 can be connected, via the opening portion P, to a mount circuit board or another device with bonding wires, solder balls and/or metal bumps.

Figure 2:
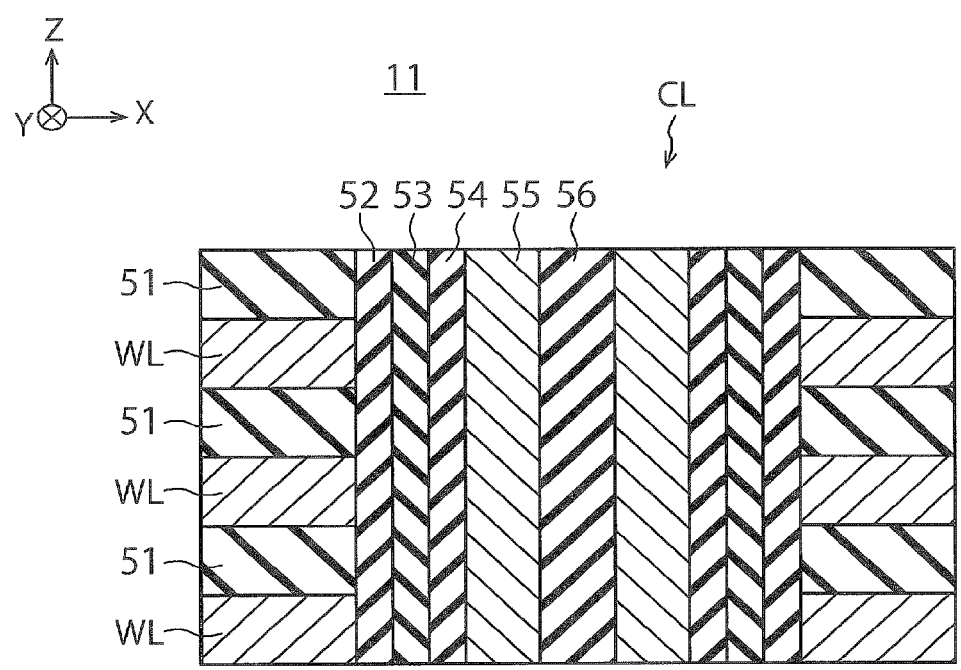
FIG. 2 is a cross-sectional view showing a structure of a columnar portion of the first embodiment.

FIG. 2 is a cross-sectional view showing a structure of the columnar portion CL of the first embodiment.

As shown in FIG. 2, the memory cell array 11 includes, on the inter layer dielectric 13 (FIG. 1), the plurality of word lines WL and a plurality of insulating layers 51 which are alternately stacked. The word lines WL are exemplarily W (tungsten) layers. The insulating layers 51 are exemplarily silicon oxide films.

The columnar portion CL sequentially includes a block insulator 52, a charge storage capacitor 53, a tunnel insulator 54, a channel semiconductor layer 55 and a core insulator 56. The charge storage capacitor 53 is exemplarily a silicon nitride film and is formed on lateral faces (side faces) of the word lines WL and the insulating layers 51 via the block insulator 52. The charge storage capacitor 53 may be a semiconductor layer such as a polysilicon layer. The channel semiconductor layer 55 is exemplarily a polysilicon layer and is formed on a lateral face of the charge storage capacitor 53 via the tunnel insulator 54. The block insulator 52, the tunnel insulator 54 and the core insulator 56 are exemplarily silicon oxide films or metal insulators.

Figure 3:
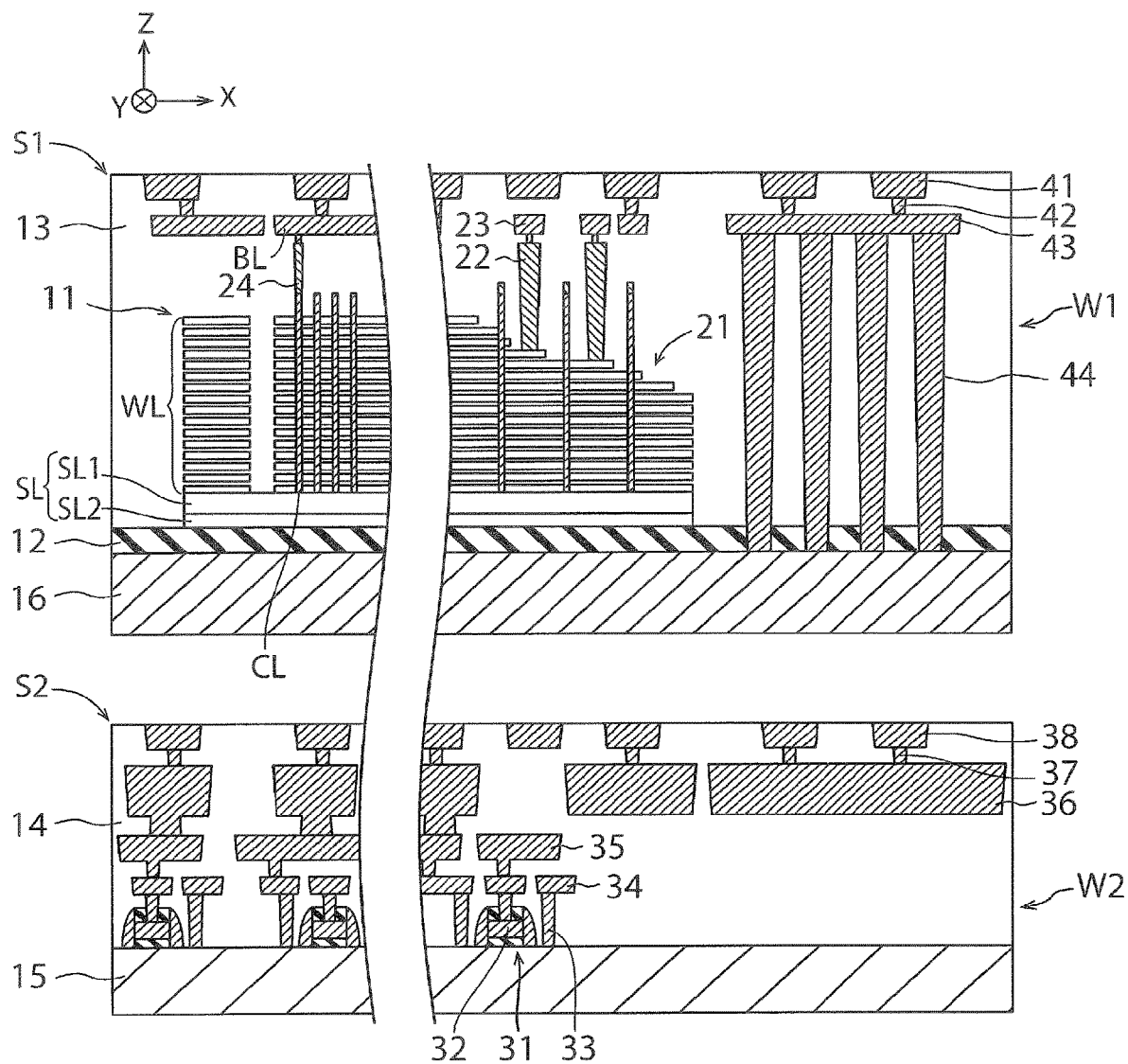
FIG. 3 is a cross-sectional view showing a method of manufacturing the semiconductor device of the first embodiment.

FIG. 3 is a cross-sectional view showing a method of manufacturing the semiconductor device of the first embodiment. FIG. 3 shows an array wafer W1 including a plurality of array chips 1 and a circuit wafer W2 including a plurality of circuit chips 2. The array wafer W1 is also called a memory wafer, and the circuit wafer W2 is also called a CMOS wafer.

Note that the orientation of the array wafer W1 in FIG. 3 is reverse to the orientation of the array chip 1 in FIG. 1. In the present embodiment, the semiconductor device is manufactured by pasting the array wafer W1 and the circuit wafer W2 together. FIG. 3 shows the array wafer W1 before its orientation is reversed for the pasting, and FIG. 1 shows the array chip 1 after its orientation is reversed for the pasting, followed by the pasting and dicing.

In FIG. 3, sign S1 designates the upper face of the array wafer W1, and sign S2 designates the upper face of the circuit wafer W2. Note that the array wafer W1 includes a substrate 16 provided beneath the insulator 12. The substrate 16 is exemplarily a semiconductor substrate such as a silicon substrate.

In the present embodiment, first, as shown in FIG. 3, the memory cell array 11, the insulator 12, the inter layer dielectric 13, the step structure portion 21, the metal pad 41 and the like are formed on the substrate 16 of the array wafer W1, and the inter layer dielectric 14, the transistor 31, the metal pad 38 and the like are formed on the substrate 15 of the circuit wafer W2. Next, the array wafer W1 and the circuit wafer W2 are pasted together under mechanical pressure. Thereby, the inter layer dielectric 13 and the inter layer dielectric 14 are bonded together. Next, the array wafer W1 and the circuit wafer W2 are annealed at 400° C. Thereby, the metal pads 41 and the metal pads 38 are joined together.

After that, the substrate 15 is made into a thin film by CMP (Chemical Mechanical Polishing), and after the substrate 16 is removed by CMP, the array wafer W1 and the circuit wafer W2 are cut into a plurality of chips. As above, the semiconductor device in FIG. 1 is manufactured. The metal pad 45 and the passivation film 46 are formed on the insulator 12, for example, after the substrate 15 is made into a thin film and the substrate 16 is removed.

While in the present embodiment, the array wafer W1 and the circuit wafer W2 are pasted together, array wafers W1 may be pasted together. The contents of the aforementioned description with reference to FIGS. 1 to 3 and the contents of description below with reference to FIGS. 4 to 10 can be applied to pasting the array wafers W1 together.

Moreover, while FIG. 1 shows the boundary surface between the inter layer dielectric 13 and the inter layer dielectric 14 and the boundary surfaces between the metal pads 41 and the metal pads 38, it is typical that these boundary surfaces are not observed after the aforementioned annealing. The positions of these boundary surfaces can be estimated, for example, by detecting inclinations of the lateral faces of the metal pads 41 and the lateral faces of the metal pads 38 and/or positional displacements between the lateral faces of the metal pads 41 and the metal pads 38.

Figure 4:
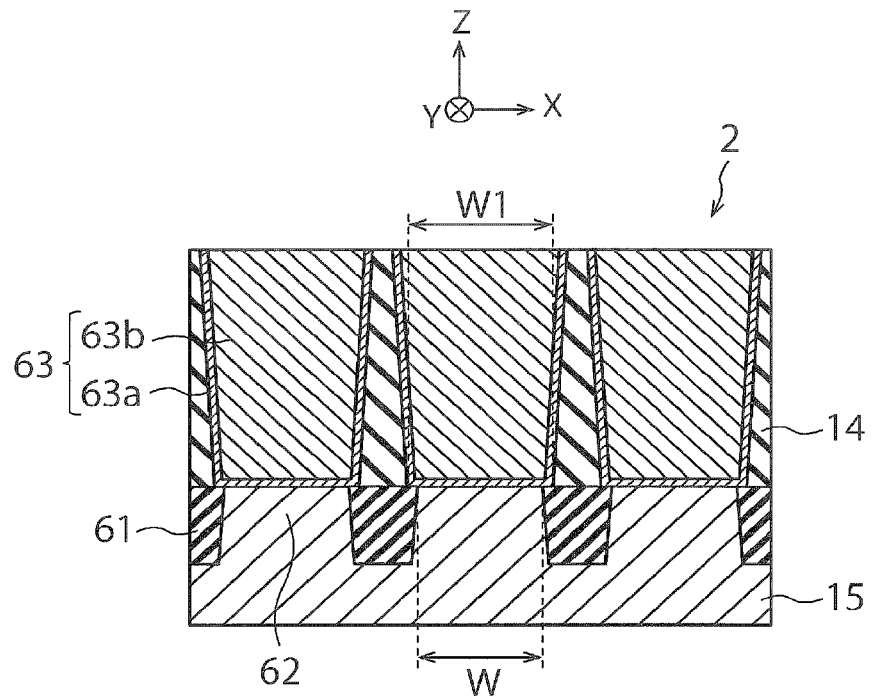
FIG. 4 is a cross-sectional view showing a structure of a circuit chip of the first embodiment.

FIG. 4 is a cross-sectional view showing a structure of the circuit chip 2 of the first embodiment.

The circuit chip 2 of the present embodiment includes the substrate 15 and the inter layer dielectric 14 formed on the substrate 15 as mentioned above, and further includes a plurality of isolation regions 61, a plurality of element regions 62 and a plurality of contact plugs 63.

These isolation regions 61 and element regions 62 extend in the Y-direction and are alternately arranged in the X-direction. The substrate 15 of the present embodiment includes a plurality of isolation trenches extending in the Y-direction, and the isolation regions 61 are formed in the isolation trenches of the substrate 15. The element regions 62 are protruding portions interposed between the isolation trenches, protrude from the substrate 15 toward the inter layer dielectric 14 in the Z-direction, extend in the Y-direction, and are adjacent to one another via the isolation regions 61 in the X-direction. The plurality of isolation trenches shown in FIG. 4 are connected to one another at a place beyond the cross section shown in FIG. 4, constituting one recess provided in the substrate 15.

Each isolation region 61 provided in the substrate 15 is formed, for example, of an insulator such as a silicon oxide film. The isolation regions 61 are also called STI (Shallow Trench Isolation) regions. Meanwhile, each element region 62 interposed between the isolation regions 61 is a portion of the substrate 15 and is a semiconductor layer such as a silicon layer. The substrate 15 of the present embodiment includes diffusion layers, and the element regions 62 are portions of the diffusion layers. Sign W designates a width of each element region 62 in the X-direction, and more in detail, designates a width of the upper face (upper end) of each element region 62 in the X-direction. The width W is exemplarily a first width. In the present embodiment, the substrate 15 including the element regions 62, and the isolation regions 61 formed in the substrate 15 constitute one substrate, and the contact plugs 63 and the like are arranged on this substrate.

The contact plugs 63 are a type of the contact plugs 33 shown in FIG. 1, are formed on the element regions 62 in the inter layer dielectric 14, and extend in the Z-direction. The contact plugs 63 are in contact with the upper faces of the element regions 62 and are electrically connected to the element regions 62. Each contact plug 63 includes a barrier metal layer 63a and a plug material layer 63b sequentially formed on the upper face of the element region 62 and the lateral face of the inter layer dielectric 14. The barrier metal layer 63a is exemplarily a metal layer containing Ti (titanium) or Ta (tantalum). The plug material layer 63b is exemplarily a metal layer containing W (tungsten), Al (aluminum) or Cu (copper).

The contact plug 63 exemplarily has a rectangular planar shape, and is also called a bar contact. Sign W1 designates a width of each contact plug 63 in the X-direction, and more in detail, designates a width of the lower face (lower end) of each contact plug 63 in the X-direction. The width W1 is exemplarily a second width. In the present embodiment, the width "W1" of the contact plugs 63 is set to be larger than the width "W" of the element regions 62 (W1>W).

Each element region 62 has a lateral face, in the +X-direction, that is in contact with the isolation region 61, and a lateral face, in the −X-direction, that is in contact with another isolation region 61. Each contact plug 63 of the present embodiment is positioned on one element region 62, on the isolation region 61 that is provided on the lateral face of the element region 62 in +X-direction, and on the isolation region 61 that is provided on the lateral face of the element region 62 in the −X-direction. Namely, each contact plug 63 of the present embodiment is arranged across one element region 62 and two isolation regions 61 sandwiching this element region 62. Such arrangement of each contact plug 63 can be realized by the width "W1" set to be larger than the width "W".

As mentioned above, the metal pad 45 (FIG. 1) functions as a bonding pad. The metal pad 45 is electrically connected to the substrate 15 via any of the metal pads 41, the metal pads 38, the contact plugs 63 and the element regions 62. Thereby, a power supply voltage or a ground voltage by way of example can be supplied to the substrate 15 from the metal pad 45.

Figure 5:
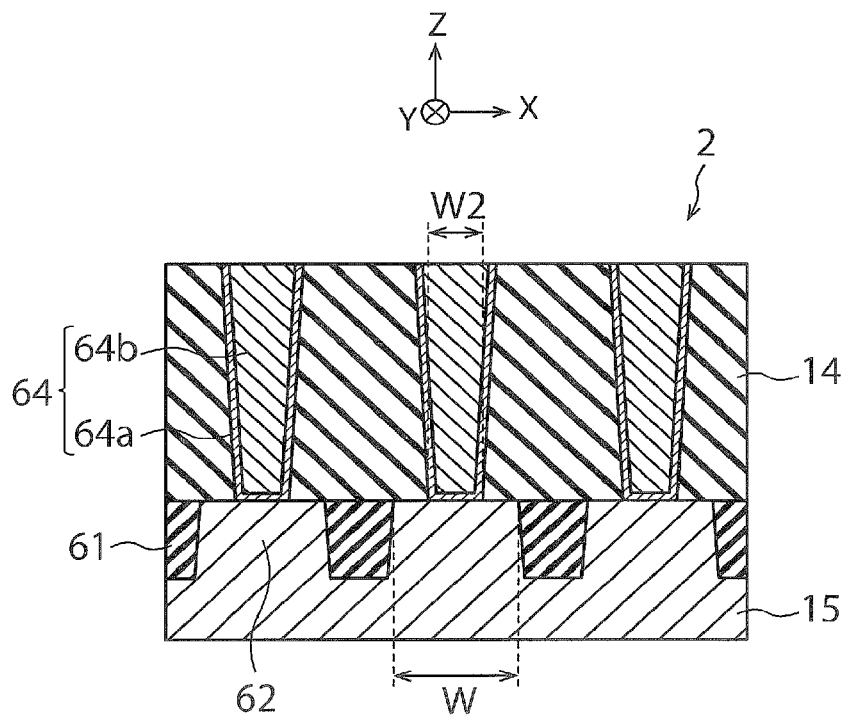
FIG. 5 is a cross-sectional view showing a structure of a circuit chip of a comparative example of the first embodiment.

FIG. 5 is a cross-sectional view showing a structure of the circuit chip 2 of a comparative example of the first embodiment.

In place of the contact plugs 63 mentioned above, the circuit chip 2 of this comparative example includes a plurality of contact plugs 64. Each contact plug 64 includes a barrier metal layer 64a similar to the aforementioned barrier metal layer 63a, and a plug material layer 64b similar to the aforementioned plug material layer 63b. The contact plug 64 exemplarily has a rectangular planar shape. Sign W2 designates a width of each contact plug 64 in the X-direction, and more in detail, designates a width of the lower face (lower end) of each contact plug 64 in the X-direction. In this comparative example, the width "W2" of the contact plugs 64 is set to be smaller than the width "W" of the element regions 62 (W2<W).

The contact plugs 63 of the first embodiment and the contact plugs 64 of the comparative example thereof are herein compared with each other.

The contact plugs 64 of this comparative example are directly formed on the substrate 15. Therefore, this comparative example problematically causes the contact resistance between the substrate 15 and the contact plug 64 to be higher as compared with a case where the contact plug 64 is formed on a salicide layer.

On the other hand, although the contact plugs 63 of the present embodiment are also directly formed on the substrate 15, the contact plugs 63 of the present embodiment have the large width W1, and specifically, the width W1 of the contact plugs 63 is set to be larger than the width W of the element regions 62. Thereby, a contact area between the contact plug 63 and the element region 62 is secured to be wide. According to the present embodiment, the contact areas between the contact plugs 63 and the element regions 62 are secured to be wide, and thereby, the contact resistances between the substrate 15 and the contact plugs 63 can be reduced.

In the present embodiment, since the width W1 of each contact plug 63 is larger than the width W of the element region 62, each contact plug 63 can be arranged across one element region 62 and two isolation regions 61 sandwiching this element region 62. As a result, in the cross section of each element region 62 shown in FIG. 4, the whole upper face of each element region 62 is in contact with the lower face of the contact plug 63. Thereby, the contact area between the contact plug 63 and the element region 62 can be secured to be as wide as possible, and the contact resistances between the substrate 15 and the contact plugs 63 can be largely reduced.

Figure 6A:
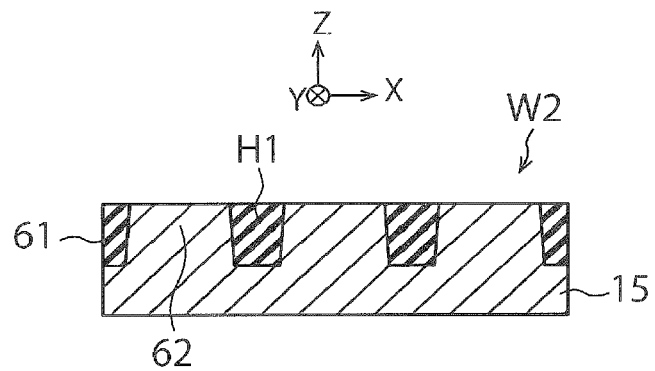
FIGS. 6A to 6C are cross-sectional views showing a method of manufacturing a circuit wafer of the first embodiment.
Figure 6B:
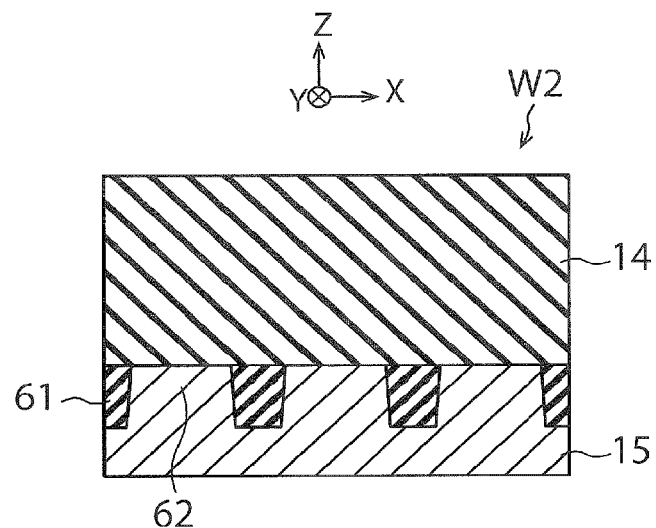
Figure 6C:
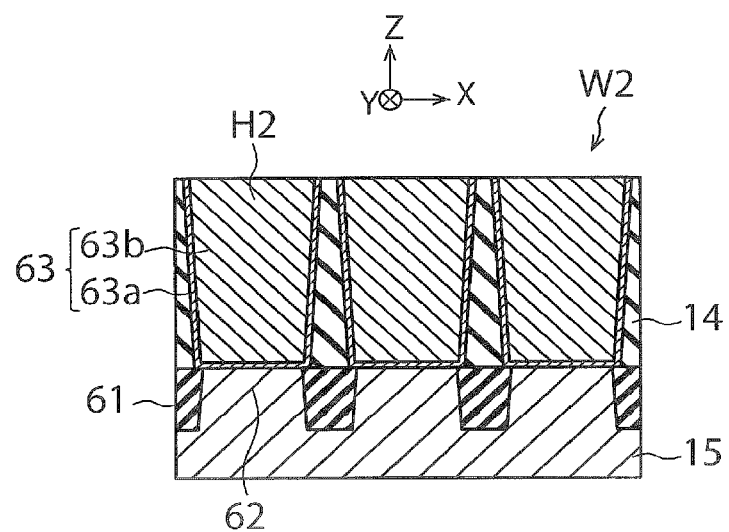

FIGS. 6A to 6C are cross-sectional views showing a method of manufacturing the circuit wafer W2 of the first embodiment.

First, a plurality of isolation trenches H1 are formed in the substrate 15, and insulators such as silicon oxide films are embedded in these isolation trenches H1 (FIG. 6A). As a result, the isolation regions 61 are formed in the isolation trenches H1, and the element regions 62 are formed between the isolation trenches H1.

Next, the inter layer dielectric 14 is formed on the whole surface of the substrate 15 (FIG. 6B). In the step of FIG. 6B, the inter layer dielectric 14 shown in FIG. 1 is not entirely formed but a portion of the same is formed.

Next, a plurality of contact holes H2 are formed in the inter layer dielectric 14, and the contact plugs 63 are formed in these contact holes H2 (FIG. 6C). In this stage, each contact hole H2 is formed so as to reach the corresponding element region 62. As a result, the contact plugs 63 are formed on the element regions 62. Each contact plug 63 is formed across the corresponding element region 62 and two isolation regions 61 sandwiching the element region 62.

After that, the array wafer W1 and the circuit wafer W2 are pasted together by the method described with reference to FIG. 3. As above, the semiconductor device in FIG. 1 is manufactured. The circuit chip 2 of the present embodiment is manufactured so as to have the structure shown in FIG. 4.

As above, the width W1 of the contact plugs 63 of the present embodiment is set to be larger than the width W of the element regions 62. Therefore, according to the present embodiment, the contact resistances between the substrate 15 and the contact plugs 63 can be reduced.

The circuit chip 2 of the present embodiment may include the contact plugs 64 shown in FIG. 5 in addition to the contact plugs 63 shown in FIG. 4. The contact plug 63 is exemplarily a source electrode or a drain electrode provided on the source diffusion layer or the drain diffusion layer of the transistor 31. Such examples are described in detail for a fourth embodiment.

Second Embodiment

Figure 7:
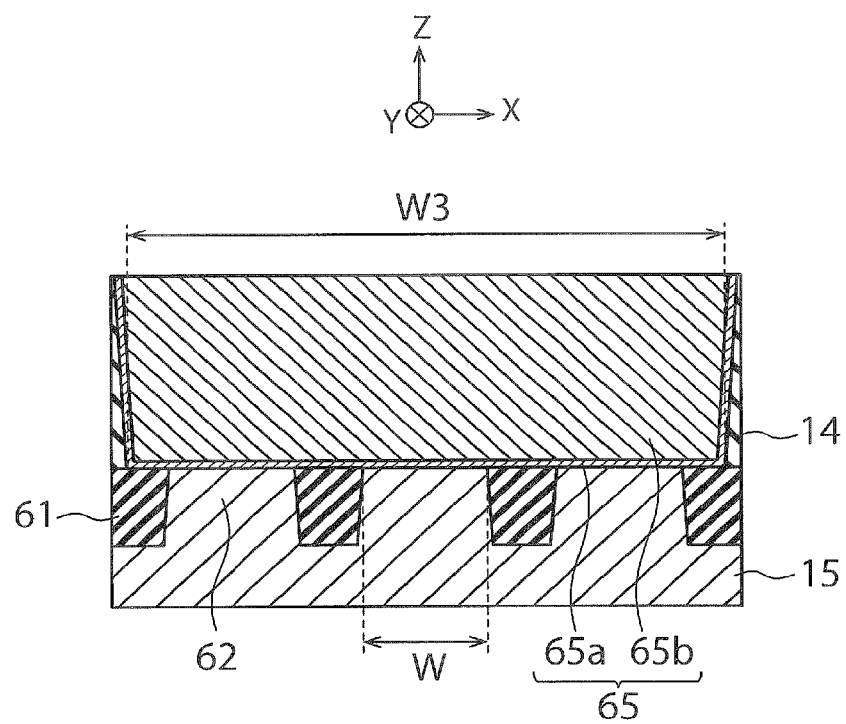
FIG. 7 is a cross-sectional view showing a structure of a circuit chip of a second embodiment.

FIG. 7 is a cross-sectional view showing a structure of the circuit chip 2 of a second embodiment.

The circuit chip 2 of the present embodiment includes a contact plug 65 in place of the aforementioned contact plugs 63. The contact plug 65 includes a barrier metal layer 65a similar to the aforementioned barrier metal layer 63a, and a plug material layer 65b similar to the aforementioned plug material layer 63b. The contact plug 65 exemplarily has a rectangular planar shape. Sign W3 designates a width of the contact plug 65 in the X-direction, and more in detail, designates a width of the lower face (lower end) of the contact plug 65 in the X-direction. In the present embodiment, the width "W3" of the contact plug 65 is set to be larger than the width "W" of the element regions 62 (W3>W). The contact plug 65 of the present embodiment extends in the Z-direction and the X-direction.

The contact plug 65 of the present embodiment is formed on a plurality of (herein, three) element regions 62. Specifically, the contact plug 65 is formed across the three element regions 62 and four isolation regions 61. In other words, the contact plug 65 of the present embodiment has a shape similar to one having three of the contact plugs 63 of the first embodiment joined. Such a contact plug 65 can be formed, for example, by forming a large contact hole similar to one having three contact holes H2 joined, in the step of FIG. 6C.

In the present embodiment, a contact area between the contact plug 65 and a plurality of element regions 62 can be secured to be wide. Therefore, according to the present embodiment, the contact area between the contact plug 65 and the element regions 62 are secured to be wide, and thereby, the contact resistance between the substrate 15 and the contact plug 65 can be reduced. Such a contact plug 65 can function as a local interconnection connecting the element regions 62 together.

Third Embodiment

Figure 8:
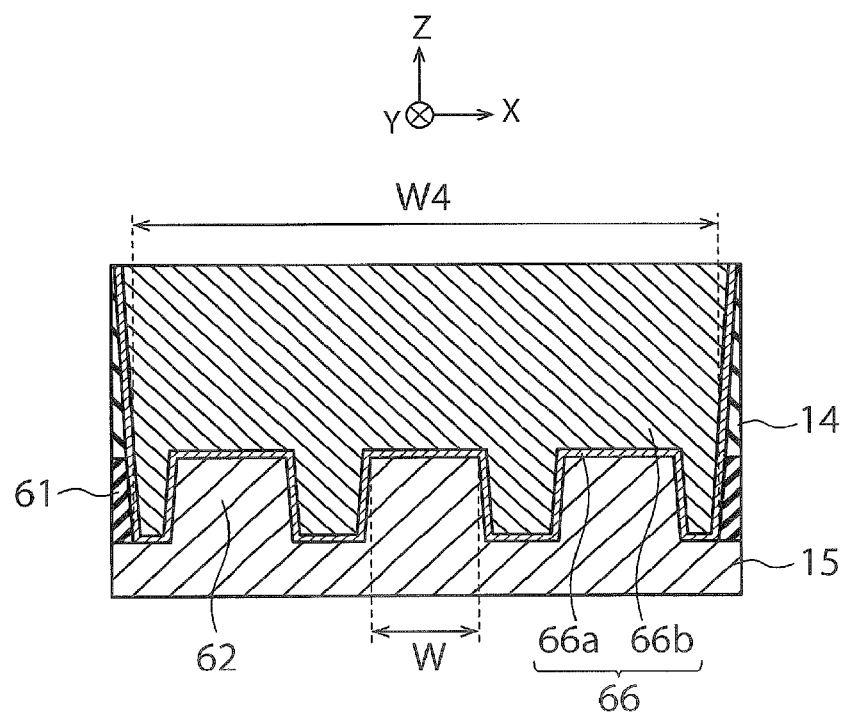
FIG. 8 is a cross-sectional view showing a structure of a circuit chip of a third embodiment.

FIG. 8 is a cross-sectional view showing a structure of the circuit chip 2 of a third embodiment.

The circuit chip 2 of the present embodiment includes a contact plug 66 in place of the aforementioned contact plugs 63. The contact plug 66 includes a barrier metal layer 66a similar to the aforementioned barrier metal layer 63a, and a plug material layer 66b similar to the aforementioned plug material layer 63b. The contact plug 66 exemplarily has a rectangular planar shape. Sign W4 designates a width of the contact plug 66 in the X-direction, and more in detail, designates a width of the lower face (lower end) of the contact plug 66 in the X-direction. In the present embodiment, the width "W4" of the contact plug 66 is set to be larger than the width "W" of the element region 62 (W4>W). The contact plug 66 of the present embodiment extends in the Z-direction and the X-direction.

The contact plug 66 of the present embodiment is formed on a plurality of (herein, three) element regions 62 similarly to the contact plug 65 of the second embodiment. In the present embodiment, the isolation regions 61 beneath the contact plug 66 are removed. Therefore, the contact plug 66 of the present embodiment is not only in contact with the upper faces of the element regions 62 but also in contact with the lateral faces of the element regions 62, and furthermore, is in contact with the upper face of the substrate 15 (that is, the bottom surfaces of the isolation trenches) being at a level lower than a level of the upper faces of the element regions 62. Such a contact plug 66 can be formed, for example, by forming a large contact hole comparable to one having three contact holes H2 joined, this contact hole being formed so as to reach the bottom surfaces of the isolation trenches, in the step of FIG. 6C.

In the present embodiment, the bottom surfaces of the isolation trenches are well diffusion layers. According to the present embodiment, the contact plug 66 is brought into contact with the bottom surfaces of the isolation trenches, and thereby, the contact plug 66 can function as a well contact.

In the present embodiment, a contact area between the contact plug 66 and a plurality of element regions 62 can be secured to be wider. Therefore, according to the present embodiment, the contact area between the contact plug 66 and the element regions 62 can be secured to be wide, and thereby, the contact resistance between the substrate 15 and the contact plug 66 can be further reduced. Such a contact plug 66 can function as a local interconnection connecting the element regions 62 together.

Fourth Embodiment

Figure 9A:
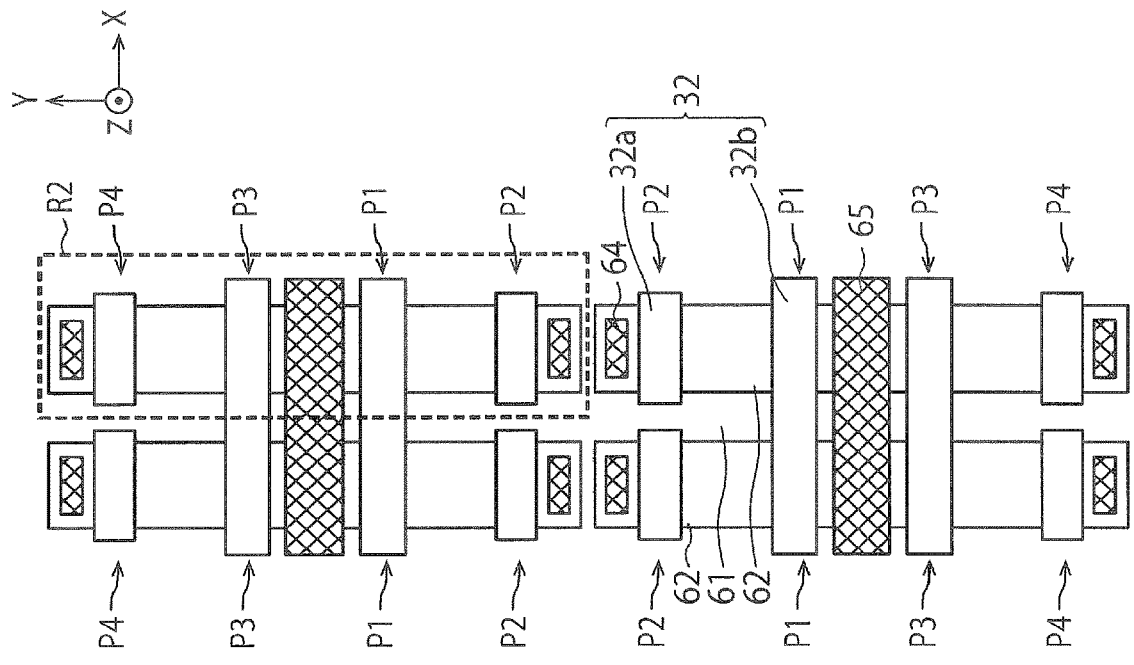
FIGS. 9A and 9B are plan views showing a structure of a circuit chip of a fourth embodiment.
Figure 9B:
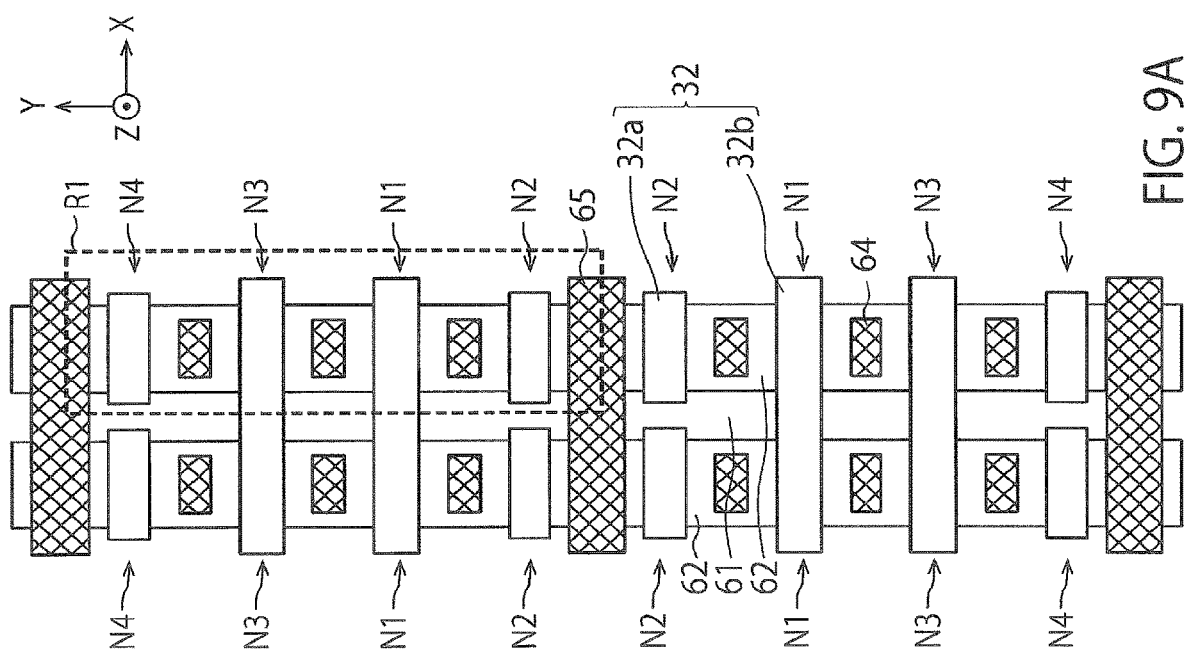

FIGS. 9A and 9B are plan views showing a structure of the circuit chip 2 of the fourth embodiment. The circuit chip 2 of the present embodiment includes the contact plugs 65 of the second embodiment and the contact plugs 64 of the comparative example of the first embodiment.

FIG. 9A shows a region, on the substrate 15 of the circuit chip 2, in which four N-type transistors N1, four N-type transistors N2, four N-type transistors N3 and four N-type transistors N4 are formed as the transistors 31. FIG. 9B shows a region, on the substrate 15 of the circuit chip 2, in which four P-type transistors P1, four P-type transistors P2, four P-type transistors P3 and four P-type transistors P4 are formed as the transistors 31. The region of FIG. 9A and the region of FIG. 9B are formed on the same substrate 15 of one circuit chip 2.

FIG. 9A shows two element regions 62 isolated from each other with the isolation region 61, and a plurality of gate electrodes 32 formed on these element regions 62 via gate insulators. These gate electrodes 32 include a plurality of gate electrodes 32a the length of each of which is smaller in the X-direction, and a plurality of gate electrodes 32b the length of each of which is larger in the X-direction. The gate electrodes 32a constitute the transistors N2 and N4, and each of them is formed on any one of the two element regions 62. The gate electrodes 32b constitute the transistors N1 and N3, and are formed across the two element regions 62.

FIG. 9A further shows a plurality of contact plugs 64 each formed on any one of the two element regions 62, and a plurality of contact plugs 65 formed across the two element regions 62. The contact plugs 64 are arranged between the transistors N2 and N1, between the transistors N1 and N3, and between the transistors N3 and N4. The contact plugs 65 are arranged at positions adjacent to the transistors N2 and at positions adjacent to the transistors N4. The contact plugs 65 in FIG. 9A are source electrodes provided on the source diffusion layers of the transistors N2 and N4, and are used for supplying a ground voltage (VSS voltage) to the transistors N2 and N4. Since in FIG. 9A, the ground potentials for the four transistors N2 may be the same, the contact plugs for these transistors N2 are integrated into the contact plug 65. The same holds true for the transistors N4. Thereby, the semiconductor device can save space in the Y-direction.

FIG. 9B shows four element regions 62 isolated from one another with the isolation region 61, and a plurality of gate electrodes 32 formed on these element regions 62 via gate insulators. These gate electrodes 32 include a plurality of gate electrodes 32a the length of each of which is smaller in the X-direction, and a plurality of gate electrodes 32b the length of each of which is larger in the X-direction. The gate electrodes 32a constitute the transistors P2 and P4, and each of them is formed on any one of the two element regions 62. The gate electrodes 32b constitute the transistors P1 and P3, and are formed across the two element regions 62.

FIG. 9B further shows a plurality of contact plugs 64 each formed on any one of the two element regions 62, and a plurality of contact plugs 65 formed across the two element regions 62. The contact plugs 64 are arranged at positions adjacent to the transistors P2, and at positions adjacent to the transistors P4. The contact plugs 65 are arranged between the transistors P1 and P3. The contact plugs 65 in FIG. 9B are source electrodes provided on the source diffusion layers of the transistors P1 and P3, and are used for supplying a power supply voltage (VDD voltage) to the transistors P1 and P3. Since in FIG. 9A, the power supply potentials for the transistors P1 and P3 may be the same, the contact plugs for these transistors P1 and P3 are integrated into the contact plugs 65. Thereby, the semiconductor device can save space in the Y-direction.

Figure 10:
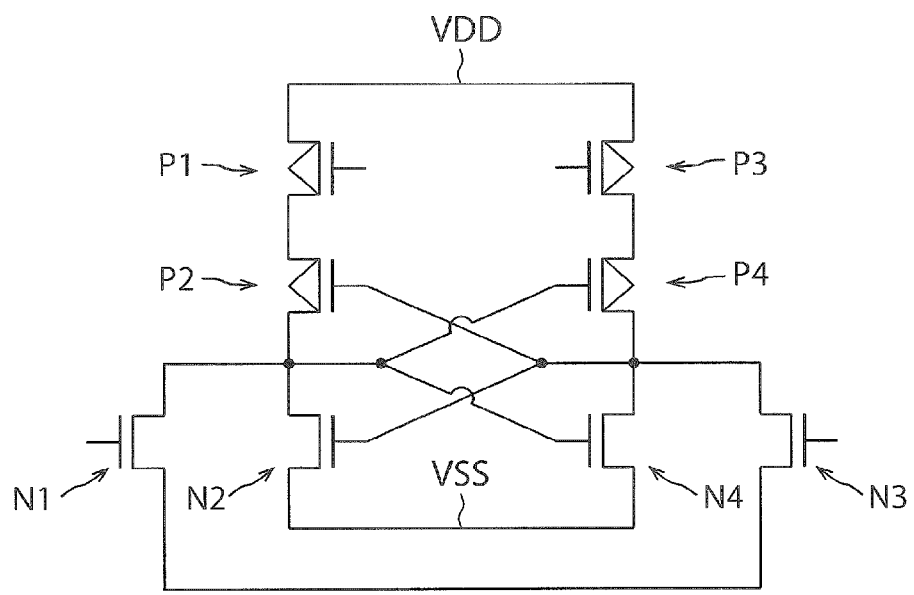
FIG. 10 is a circuit diagram showing circuit configurations of a region R1 and a region R2 in FIGS. 9A and 9B.

FIG. 10 is a circuit diagram showing circuit configurations of a region R1 and a region R2 in FIGS. 9A and 9B.

The region R1 includes one N-type transistor N1, one N-type transistor N2, one N-type transistor N3 and one N-type transistor N4. The region R2 includes one P-type transistor P1, one P-type transistor P2, one P-type transistor P3 and one P-type transistor P4.

The sources of the transistors P1 and P3 are connected to a power supply line (VDD line). The drains of the transistors P1 and P3 are connected to the sources of the transistors P2 and P4, respectively. The drain of the transistor P2 is connected to the drains of the transistors N1 and N2 and the gates of the transistors N4 and P4. The drain of the transistor P4 is connected to the drains of the transistors N3 and N4 and the gates of the transistors N2 and P2. The sources of the transistors N1 and N3 are connected to each other. The sources of the transistors N2 and N4 are connected to a ground line (VSS line). The region R1 and the region R2 constitute the circuit as above.

The circuit chip 2 of the present embodiment includes many regions having the identical circuit configurations to that of the region R1, and many regions having the identical circuit configurations to that of the region R2. FIGS. 9A and 9B exemplarily show four regions, including the region R1, having the identical circuit configurations to that of the region R1 and four regions, including the region R2, having the identical circuit configurations to that of the region R2.

According to the present embodiment, the source electrodes of the transistors N2, N4, P1 and P3 are formed of the contact plugs 65 of the second embodiment, and thereby, the contact resistances between the substrate 15 and the contact plugs supplying the power supply voltage and the ground voltage can be reduced. Since the contact resistances largely affect the power supply voltage and the ground voltage, according to the present embodiment, efficiency of voltage supply of the circuit chip 2 can be effectively improved.

The source electrodes of the transistor N2, N4, P1 and P3 of the present embodiment may be formed of the contact plugs 63 of the first embodiment or may be formed of the contact plugs 66 of the third embodiment. Since in the latter case, the contact areas between the substrate 15 and the contact plugs 66 can be easily secured to be wide, the areas of the region R1 and the region R2 can be reduced while the contact resistances are maintained to be low. Thereby, the degree of integration in the semiconductor device can be improved.

Moreover, the contact plugs 63 of the first embodiment, the contact plugs 65 of the second embodiment, and/or the contact plugs 66 of the third embodiment may be the drain electrodes of the transistors 31. Thereby, the contact resistances at the drain electrodes can be reduced.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a substrate including a first element region extending in a first direction parallel to a surface of the substrate, a second element region provided in a second direction of the first element region and extending in the first direction, and an isolation region provided between the first element region and the second element region, the second direction crossing the first direction;
    an interconnection layer provided above the substrate;
    an insulator provided between the substrate and the interconnection layer; and
    a plug extending in the second direction and in a third direction crossing the first and second directions in the insulator, provided on the first element region, the isolation region, and the second element region, electrically connecting the first element region and the second element region to the interconnection layer, and electrically connecting the first element region to the second element region.

2. The device of claim 1, wherein the second element region is adjacent to the first element region via the isolation region in the second direction.

3. The device of claim 2, wherein
    the substrate includes three or more element regions including the first element region and the second element region, and two or more isolation regions including the isolation region, and
    the plug is provided on each of the three or more element regions and electrically connected to the three or more element regions and the interconnection layer.

4. The device of claim 1, wherein the plug is provided on an upper face and a lateral face of the first element region and an upper face and a lateral face of the second element region.

5. The device of claim 4, wherein the plug is in contact with an upper face of the substrate, the upper face of the substrate being at a level lower than a level of the upper face of the first element region and the upper face of the second element region.

6. The device of claim 4, wherein
    the substrate includes three or more element regions including the first element region and the second element region, and
    the plug is provided on each of the three or more element regions and electrically connected to the three or more element regions and the interconnection layer.

7. The device of claim 1, wherein
each of the first element region and the second element region has a first width in the second direction, and
the plug has a second width in the second direction larger than the first width.

8. The device of claim 1, wherein the first element region and the second element region include diffusion layers provided in the substrate.

9. The device of claim 1, wherein the plug is a source electrode or a drain electrode provided on a source diffusion layer or a drain diffusion layer of a transistor.

10. The device of claim 1 further comprising:
a first pad provided above the substrate and electrically connected to the first element region and the second element region via the plug;
a second pad provided on the first pad; and
a bonding pad provided above the second pad and electrically connected to the second pad.

11. A method of manufacturing a semiconductor device, comprising:
forming, in a substrate, a first element region extending in a first direction parallel to a surface of the substrate, a second element region provided in a second direction of the first element region and extending in the first direction, and an isolation region provided between the first element region and the second element region, the second direction crossing the first direction;
forming an insulator on the substrate;
forming an interconnection layer on the insulator; and
forming a plug extending in the second direction and in a third direction crossing the first and second directions in the insulator, provided on the first element region, the isolation region, and the second element region, electrically connecting the first element region and the second element region to the interconnection layer, and electrically connecting the first element region to the second element region.

12. The method of claim 11,
wherein the second element region is adjacent to the first element region via the isolation region in the second direction.

13. The method of claim 12, further comprising forming, in the substrate, three or more element regions including the first element region and the second element region, and two or more isolation regions including the isolation region,
wherein the plug is formed on each of the three or more element regions and electrically connected to the three or more element regions and the interconnection layer.

14. The method of claim 11, wherein the plug is formed on an upper face and a lateral face of the first element region and an upper face and a lateral face of the second element region.

15. The method of claim 14, wherein the plug is formed so as to be in contact with an upper face of the substrate, the upper face of the substrate being at a level lower than a level of the upper face of the first element region and the upper face of the second element region.

16. The method of claim 14, further comprising forming, in the substrate, three or more element regions including the first element region and the second element region,
wherein the plug is formed on each of the three or more element regions and electrically connected to the three or more element regions and the interconnection layer.

17. The method of claim 11, wherein
each of the first element region and the second element region is formed to have a first width in the second direction, and
the plug is formed to have a second width in the second direction larger than the first width.

18. The method of claim 11, further comprising:
forming, above the substrate, a first pad electrically connected to the first element region and the second element region via the plug;
forming a second pad on the first pad; and
forming, above the second pad, a bonding pad electrically connected to the second pad.

* * * * *